United States Patent [19]
Tang et al.

[11] 4,236,164
[45] Nov. 25, 1980

[54] BIPOLAR TRANSISTOR STABILIZATION STRUCTURE

[75] Inventors: Henry Y. S. Tang, New York, N.Y.;
Henry Y. S. Tang, New York, N.Y.

[73] Assignee: Bell Telephone Laboratories, Incorporated, Murray Hill, N.J.

[21] Appl. No.: 865,236

[22] Filed: Dec. 28, 1977

[51] Int. Cl.³ .......................................... H01L 27/02
[52] U.S. Cl. ..................................... 357/51; 357/34; 357/36; 357/86; 307/237
[58] Field of Search ................... 357/36, 86, 34, 51; 307/237, 300, 254

[56] References Cited

U.S. PATENT DOCUMENTS

| | | | |
|---|---|---|---|
| 3,631,311 | 12/1971 | Engbert | 357/36 |
| 3,766,449 | 10/1973 | Bruchez | 357/36 |
| 4,047,220 | 9/1977 | Ferro et al. | 357/36 |
| 4,143,455 | 3/1979 | Schwabe et al. | 357/34 |
| 4,146,905 | 3/1979 | Appels et al. | 357/34 |

FOREIGN PATENT DOCUMENTS 2410092  9/1975  Fed. Rep. of Germany ............ 357/36

*Primary Examiner*—Joseph E. Clawson, Jr.
*Attorney, Agent, or Firm*—Irwin Ostroff; Arthur J. Torsiglieri

[57] ABSTRACT

A bipolar transistor structure consists of a standard structure and in addition consists of a low resistance-high impurity concentration region in the collector which contacts a nonactive portion of the base. The resistance between the base contact and the low resistance-high impurity concentration region of the collector, coupled with the capacitance between the two regions, results in the equivalent of a series R-C network between the base contact and the collector contact. The values of resistance and capacitance of this network are selected to insure "absolute" stability of the transistor when operated in a circuit.

4 Claims, 2 Drawing Figures

BIPOLAR TRANSISTOR STABILIZATION STRUCTURE

BACKGROUND OF THE INVENTION

This invention relates to semiconductor devices and in particular, to bipolar semiconductor devices and means of stabilizing same.

High frequency bipolar transistors, such as those typically used with Emitter Coupled Logic (ECL) circuits, have a tendency of being conditionally stable. Measurements have shown that this conditional stability appears as a negative real part of the input impedance which can cause undesirable oscillations. One solution to this problem is the addition of a resistor in series with the base to cancel the negative resistance and thereby increase stability. This solution can significantly increase the response time of the transistor. Other solutions are to increase the collector resistance, which adversely affects response time, or to significantly increase the collector-base capacitance, which also adversely affects response time. Another solution is to add the series combination of a resistor and transistor between the base and collector of the transistor whose operation is to be stabilized. This solution is very expensive in terms of the added silicon area needed for the implementation thereof.

It would be desirable to be able to compensate for transistor instability without significantly affecting transistor response time, fanout capability, or the physical size of the transistor structure.

SUMMARY OF THE INVENTION

A solution of the above-described problem is attained in an illustrative embodiment of the invention comprising a bipolar transistor having a collector comprising at least first and second regions that are of one conductivity type but are of different impurity concentrations, and a base region of the opposite conductivity type having an active portion through which essentially all collector-emitter conduction occurs and a nonactive portion which is in contact with the first region of the collector region. The first region of the collector has a greater conductivity than the second region of the collector. An emitter region having the same conductivity type as the collector region is located within a portion of the base region. Electrical contacts are made to the base, emitter and collector.

The geometry and resistivity of the nonactive portion of the base determine the value of the effective resistance which is added between the base and the collector. The impurity concentration of the nonactive base and the first region of the collector, as well as the contact area between the nonactive base and the first region, determine the effective capacitance which is in series with the effective resistance between the base and collector. The proper selection of the values of the added series resistance and capacitance negates the negative resistance effect and thus helps insure stable operation.

These and other features of the invention will be better understood from a consideration of the following detailed description taken in conjunction with the following drawings.

DETAILED DESCRIPTION

Figure 1:
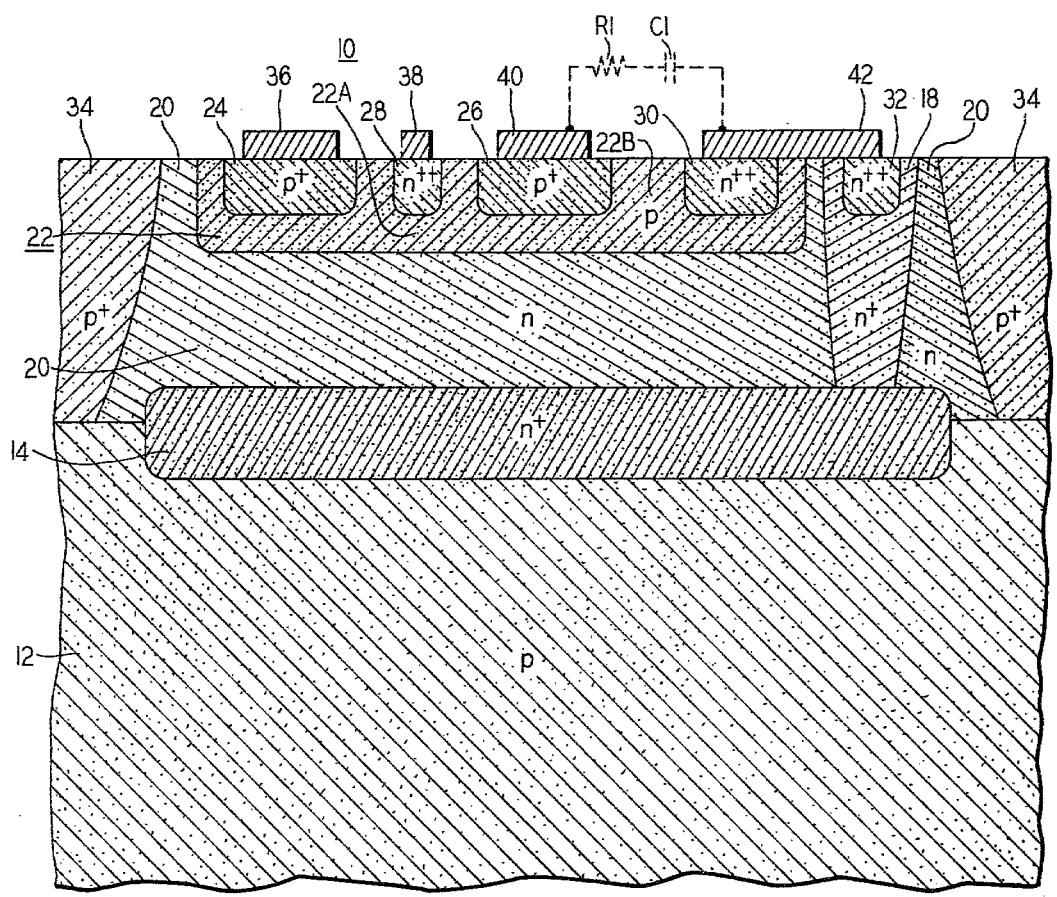
FIG. 1 illustrates a transistor structure in accordance with one embodiment of the invention.

Referring now to FIG. 1, there is illustrated a cross-sectional view of a semiconductor structure comprising a bipolar transistor 10. Transistor 10, while illustrated as an n-p-n transistor, could also be a p-n-p transistor.

Transistor 10 is illustrated with a p-type substrate 12 and an n+ type buried collector layer 14 with an n+ type deep collector region 18 being in contact therewith. N-type active collector region 20 of transistor 10 is typically a portion of an epitaxial layer. Base region 22 is p-type having an active portion 22A, and a nonactive portion 22B. Regions 24 and 26 are p+ type regions in base regions 22 which allow low resistance ohmic contact thereto. An n++ type collector contact region 32 within region 18 allows low resistance ohmic contact thereto. An n++ type emitter region 28 is illustrated located between regions 24 and 26. Another n++ type region 30 is illustrated within the base region 22 and to the right of region 26. This serves as a passive collector region which forms a p-n junction with the nonactive portion of the base. Region 34 is a p+ type isolation region which extends all around transistor 10. Metal contacts 36, 38 and 40 are illustrated contacting regions 24, 28, and 26, respectively. Metal contact 42 makes low resistance ohmic contact to regions 30 and 32 and serves as the collector contact of transistor 10. Metal contact 42 does not make any contact to the relatively low impurity p-type base 22 or to the relatively low impurity n-type collector 22. An oxide layer (not illustrated) may be used between metal contact 42 and the portions of base 22 and collector 20 that 42 crosses. This provides improved electrical isolation. Alternatively regions 24 and 26 may be parts of an annular region surrounding region 28. Metal contacts 36 and 40 are electrically connected together and serve as the base contact of transistor 10. Metal contact 38 serves as the emitter contact of transistor 10.

During conduction through transistor 10 essentially all of the current flow occurs between emitter 28 and collector 20. Portion 22A of base region 22 (that region near and around emitter 28) is the region through which essentially all transistor emitter-collector conduction occurs and is denoted as the "active base." Portion 22B of base region 22 (that region between regions 26 and 30 and near and around region 30) is denoted as the "nonactive base." There is essentially no conduction from region 30 through 22B to collector 20.

Dashed-lined resistor R1 represents the resistance between base contacts 36 and 40 and passive collector region 30. Dashed-lined capacitor C1 represents the capacitance associated with the p-n junction between regions 22B and 30. As is illustrated, R1 and C1 are essentially serially connected between base contact 40 and collector contact 41. Thus an AC impedance path comprising the series combination of R1 and C1 exists between base contact 40 and collector contact 42 of transistor 10. This electrical path adds a positive ohmic value of R1 to the equivalent series input resistor (not shown) of transistor 10.

It is known that at high frequencies the input impedance looking into the base of a bipolar transistor operating in a circuit can have a negative real part (i.e., resistive part). This could result in undesirable oscillations. The transistor structure 10 of FIG. 1 adds a positive resistance to the normal transistor input resistance and thus effectively cancels the negative input resistance which occurs at high frequencies. This tends to prevent the possibility of oscillations occuring.

The ohmic value of R1 can be controlled by: (1) varying the distance between regions 26 and 30, (2) varying the resistivity of all of base 22; (3) varying the resistivity of base region 22B independently of region 22A; and (4) varying the geometry of region 22B. The capacitive value of C1 can best be controlled by varying the junction area between regions 30 and 22B and/or impurity concentration of region 30. Values for R1 and C1 are selected to compensate for essentially any negative input resistance of transistor 10 at essentially any frequency. This compensation facilitates the stable operation of transistor 10.

The structure of FIG. 1 has been fabricated on a p-substrate of <100>-type silicon material having a resistivity 15 ohms/cm. The sheet resistivity of the material of regions 14, 18, and 20 is approximately 20, 5 and 700 ohms per square, respectively. The sheet resistivity of the material of regions 24, 26, and 22, and regions 28, 30 and 32 is approximately 100, 100, 520, 10, 10, and 10 ohms per square, respectively. The spacing between region 26 and region 30 is 10 microns. Region 30 is 11 microns wide by 29 microns long and has a diffusion depth of about 0.54 microns. The value of R1 is approximately 600 ohms and the value of C1 is approximately 0.4 pF.

Measurements of the input resistance of the fabricated transistor versus frequency indicated that the input resistance stayed positive. The fabricated transistor when used in an emitter follower configuration and connected to emitter coupled logic circuitry exhibited no oscillations under any input conditions. The fabricated transistor is only twenty percent larger than a transistor fabricated using the same design rules but without the added n++ type region in the base.

In standard bipolar transistors, which use a deep heavily doped buried collector, the lightly doped portion of the collector contracts the base and the capacitance of the collector-base junction is generally insufficient to provide a low AC path between the base contact and the collector contact. In addition, the resistance of the base which is in series with the capacitor of the collector-base junction is of insufficient magnitude to provide for cancellation of the negative input resistance which can result during transistor operation. Thus many standard bipolar transistors tend to be conditionally stable.

Figure 2:
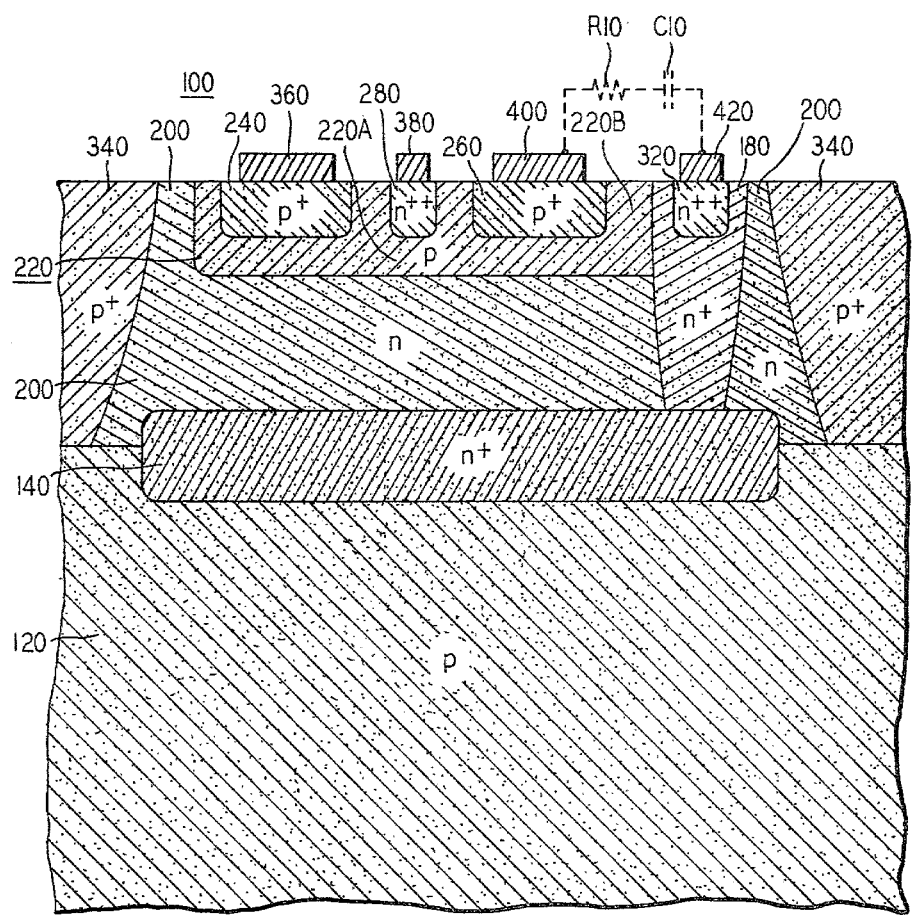
FIG. 2 illustrates another transistor structure in accordance with another embodiment of the invention.

Now referring to FIG. 2 there is illustrated a cross-sectional view of another semiconductor structure comprising a bipolar transistor 100. Transistor 100 is similar to transistor 10 of FIG. 1 and corresponding regions have the same numerical designation except that an extra 0 is added to the end of each numerical designation. Transistor 100 differs from transistor 10 in that region 30 has been eliminated and region 180 (corresponding to region 18 of FIG. 1) is shifted to the left to a position that coincides with that of region 30 of FIG. 1. In addition, base region 220B is shortened to end at region 180. Transistor 100 is typically thirty percent smaller than transistor 10 of FIG. 1 and ten percent smaller than a standard transistor fabricated using the same design rules. The series combination of R10 and C10 performs the same function as R1 and C1 of FIG. 1.

It is to be understood that the embodiments described herein are merely illustrative of the general principles of the invention. Various modifications are possible within the scope of the invention. For example, region 22B can be terminated at the left edge of region 30 or continued so as to partially surround region 30. Still further, region 30 can be of a different impurity concentration than regions 28 or 32. Still further, region 30 can partially or wholly merge into regions 18 and/or 32. It should be understood that this transistor can be part of an integrated circuit device.

What is claimed is:

1. A transistor structure having a semiconductive body comprising:

a collector region of one conductivity type;

a base region located within a portion of the collector region, the base region having an active portion and a nonactive portion which are both of the opposite conductivity type of the collector region;

an emitter region of the one conductivity type located within a portion of the base region;

base contact means for providing low resistance electrical contact to the base region;

means for avoiding conditional stability when the transistor is operated in a circuit, the means including a first region of the one conductivity type but of a higher impurity concentration than the collector region; the first region being in contact with the nonactive portion of the base region, spaced apart from the base contact means, and electrically coupled to the collector region to form a compensating network comprising an equivalent resistance and capacitance serially coupled between the base contact means and the collector region; the resistance and capacitance having suitable values to stabilize the circuit, the values of the resistance and capacitance being substantially determined by the resistivity and/or geometry of the nonactive portion of the base region, the impurity concentration of the first region and/or the contact area between the first region and the nonactive portion of the base region.

2. The apparatus of claim 1 wherein the first region is at least partially in a portion of the nonactive base region.

3. The apparatus of claim 1 wherein the first region is wholly surrounded by the nonactive portion of the base and is electrically coupled to the collector region via a relatively low resistance path.

4. The transistor of claim 1 wherein the base contact means include a base contact region of the opposite conductivity type but which facilitates making low resistance contact to the base region.

* * * * *

UNITED STATES PATENT AND TRADEMARK OFFICE
CERTIFICATE OF CORRECTION

PATENT NO. : 4,236,164
DATED : November 25, 1980
INVENTOR(S) : Henry Y. S. Tang

It is certified that error appears in the above—identified patent and that said Letters Patent is hereby corrected as shown below:

On the page before column 1 and after the title,

"Inventors" should read --Inventor--, delete "Henry Y. S. Tang, New York, N.Y.;".

Signed and Sealed this

Ninth Day of June 1981

[SEAL]

Attest:

RENE D. TEGTMEYER

Attesting Officer

Acting Commissioner of Patents and Trademarks